US010896947B2

(12) United States Patent
Yi et al.

(10) Patent No.: US 10,896,947 B2
(45) Date of Patent: Jan. 19, 2021

(54) DISPLAY DEVICE INCLUDING CONNECTIVE WIRINGS WITHIN A DISPLAY AREA THEREOF

(71) Applicant: SAMSUNG DISPLAY CO., LTD., Yongin-si (KR)

(72) Inventors: Minseong Yi, Yongin-si (KR); Seungmin Lee, Yongin-si (KR); Jungkyu Lee, Yongin-si (KR); Seunghwan Cho, Yongin-si (KR); Gyungsoon Park, Yongin-si (KR); Jaeun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/522,096

(22) Filed: Jul. 25, 2019

(65) Prior Publication Data
US 2020/0227503 A1      Jul. 16, 2020

(30) Foreign Application Priority Data
Jan. 10, 2019   (KR) .................. 10-2019-0003283

(51) Int. Cl.
*H01L 27/32*      (2006.01)

(52) U.S. Cl.
CPC .......... *H01L 27/3276* (2013.01); *H01L 27/32* (2013.01)

(58) Field of Classification Search
CPC .............. H01L 27/124–1244; H01L 23/58–66
See application file for complete search history.

(56) References Cited

U.S. PATENT DOCUMENTS

| 10,115,337 | B2 | 10/2018 | Kim et al. | |
| 2015/0237726 | A1* | 8/2015 | Shin | H05K 3/361 |
| | | | | 361/749 |
| 2017/0047036 | A1 | 2/2017 | Hao et al. | |
| 2017/0329191 | A1* | 11/2017 | Nakagawa | G02F 1/1343 |
| 2018/0166037 | A1 | 6/2018 | Lee et al. | |

FOREIGN PATENT DOCUMENTS

| CN | 104020604 | 9/2014 |
| JP | 2852073 | 1/1999 |
| KR | 10-2007-0077245 | 7/2007 |
| KR | 10-1166620 | 7/2012 |
| KR | 10-2016-0129174 | 11/2016 |
| KR | 10-2018-0066342 | 6/2018 |

OTHER PUBLICATIONS

European Search Report for Application No. 19186404.0 dated Feb. 4, 2020.

* cited by examiner

*Primary Examiner* — Julio J Maldonado
*Assistant Examiner* — Mohammad A Rahman
(74) *Attorney, Agent, or Firm* — F. Chau & Associates, LLC

(57) ABSTRACT

A display device includes a substrate having a display area, a peripheral area at least partially surrounding the display area, and a pad area within the peripheral area. A plurality of data lines is disposed within the display area. A plurality of connection wirings is disposed within the display area, connected to the plurality of data lines, and configured to transmit a data signal from the pad area to the plurality of data lines. Each of the plurality of connection wirings includes a plurality of branches that protrude from the connection wirings in a direction perpendicular to a direction in which the connection wirings are primarily extended.

20 Claims, 15 Drawing Sheets

DISPLAY DEVICE INCLUDING CONNECTIVE WIRINGS WITHIN A DISPLAY AREA THEREOF

CROSS-REFERENCE TO RELATED APPLICATION

This application claims the benefit of Korean Patent Application No. 10-2019-0003283, filed on Jan. 10, 2019, in the Korean Intellectual Property Office, the disclosure of which is herein incorporated by reference in its entirety.

TECHNICAL FIELD

The present disclosure relates to a display device and, more specifically, to a display device including connective wirings within a display area of the display device.

Discussion of the Related Art

As display devices have become larger, the non-display area that surrounds the display area has been reduced in size. While this creates a display device with a modern look, there is less available space for disposing the driving circuits and wirings for driving the pixels of the display device, which have traditionally been disposed along the non-display area.

SUMMARY

A display device includes a substrate having a display area, a peripheral area at least partially surrounding the display area, and a pad area within the peripheral area. A plurality of data lines is disposed within the display area. A plurality of connection wirings is disposed within the display area, connected to the plurality of data lines, and configured to transmit a data signal from the pad area to the plurality of data lines. Each of the plurality of connection wirings includes a plurality of branches that protrude from the connection wirings in a direction perpendicular to a direction in which the connection wirings are primarily extended.

A display device includes a substrate having a display area, a peripheral area at least partially surrounding the display area, and a pad area within the peripheral area. A plurality of data lines is disposed within the display area. A plurality of connection wirings is disposed within the display area, connected to the plurality of data lines, and configured to transmit a data signal supplied from the pad area to the plurality of data lines. The display area includes a first area in which the plurality of connection wirings extend in a first direction, and a second area in which the plurality of connection wirings extend in a second direction that is perpendicular to the first direction.

BRIEF DESCRIPTION OF THE DRAWINGS

A more complete appreciation of the present disclosure and many of the attendant aspects thereof will become apparent and more readily appreciated from the following description of the embodiments, taken in conjunction with the accompanying drawings in which.

DETAILED DESCRIPTION

Figure 1:
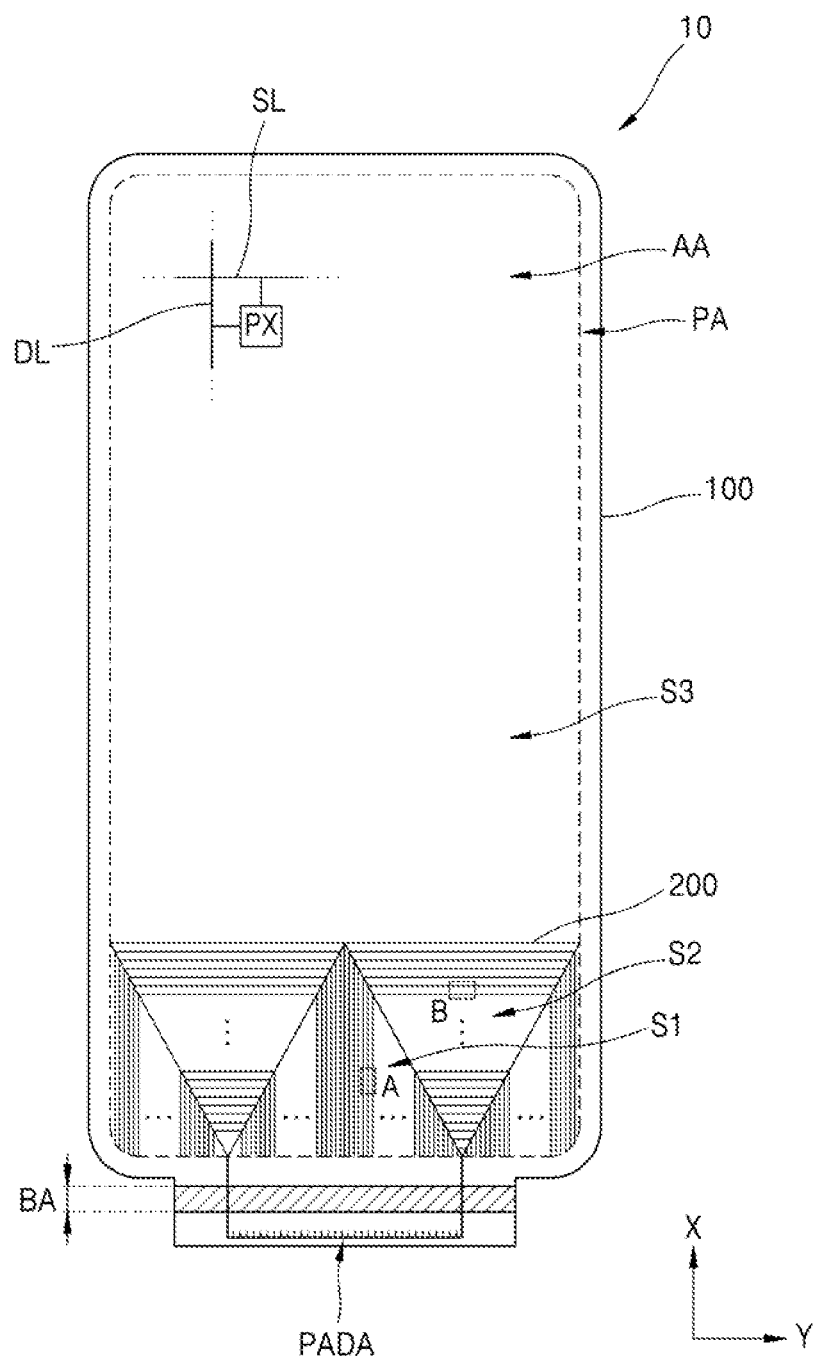
FIG. 1 is a plan view illustrating a display device according to an exemplary embodiment of the present disclosure.

Reference will now be made in detail to embodiments, examples of which are illustrated in the accompanying drawings, wherein like reference numerals may refer to like elements throughout the specification and the drawings. In this regard, the present embodiments may have different forms than what is set forth herein.

It will be understood that although the terms "first", "second", etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components. In contrast, the phrase "consisting of" precludes the addition of unlisted features or components.

It will be understood that when a layer, region, or component is referred to as being "formed on," another layer, region, or component, it may be directly or indirectly formed on the other layer, region, or component. For example, for example, intervening layers, regions, or components may be present.

Sizes of elements in the drawings may be exaggerated for convenience of explanation.

Hereinafter, embodiments of the present disclosure will be described below in more detail with reference to the accompanying drawings. Those components that are the same or are in correspondence are rendered the same reference numeral regardless of the figure number.

FIG. 1 is a plan view illustrating a display device according to an exemplary embodiment of the present disclosure.

Referring to FIG. 1, a display device 10, according to an exemplary embodiment of the present disclosure, may include a display area AA in which an image is displayed, and a peripheral area PA outside of, and at least partially surrounding, the display area AA. Thus, the substrate 100 has the display area AA and the peripheral area PA.

A plurality of pixels PX and wirings for applying an electrical signal to the plurality of pixels PX may be disposed in the display area AA.

Each of the plurality of pixels PX may include a light-emitting device and a circuit portion for driving the light-emitting device. According to an exemplary embodiment of the present disclosure, the light-emitting device may be an organic light-emitting device, and the circuit portion may include a plurality of transistors and a capacitor, in addition to various other supporting elements.

The wirings for applying an electrical signal to the plurality of pixels PX may include a plurality of scan lines SL and a plurality of data lines DL. According to an exemplary embodiment of the present disclosure, the plurality of scan lines SL may be arranged in a plurality of rows and may transmit a scan signal to the pixels PX, and the plurality of data lines DL may be arranged in a plurality of columns and may transmit a data signal to the pixels PX. The plurality of pixels PX may be disposed in a portion where the plurality of scan lines SL and the plurality of data lines DL intersect each other.

Connection wirings 200 for transmitting the electrical signal supplied from a pad area PADA to the wirings connected to the pixels PX may be disposed in the display area AA. For example, the connection wirings 200 may be connected to the data lines DL and may transmit the data signal supplied from the pad area PADA to the data lines DL.

Meanwhile, because a length of one side of the display area AA adjacent to the pad area PADA (e.g. the vertical sides, as shown) is greater than a length of the pad area PADA (e.g. the bottom side, as shown), the connection wirings 200 have to be widely spread to correspond to one side of the display area AA at a position corresponding to the pad area PADA. To this end, the connection wirings 200 may extend in a first direction X, may be bent in a direction parallel to a second direction Y, perpendicular to the first direction X, may extend towards edges of the display area AA, and then may be bent in a direction parallel to the first direction X and may extend in the first direction X, as shown in FIG. 1. Thus, the data signal supplied from the center of one side of the display area AA may be transmitted to the data lines DL from an end of one side of the display area AA. Thus, the area of the peripheral area PA may be reduced compared to fan-out wirings according to the related art in the peripheral area PA, so that a dead space of the display device 10 may be reduced.

Meanwhile, the display area AA may be divided into a plurality of areas according to an extension direction of the connection wirings 200. For example, the display area AA may include a first area S1 in which the connection wirings 200 extend in the direction parallel to the first direction X, a second area S2 in which the connection wirings 200 extend in the direction parallel to the second direction Y, and a third area S3 that is the remaining area of the display area AA excluding the first area S1 and the second area S2. The third area S3 may be an area in which the connection wirings 200 are not disposed.

There may be a plurality of first areas S1 and a plurality of second areas S2, and each of the plurality of first areas S1 and the plurality of second areas S2 may have a substantially triangular shape. For example, to prevent a short-circuit between the connection wirings 200, an extension length of the connection wirings 200 that extend in the first direction X from the middle portion of the central, first area S1 may be greater than the extension length of the connection wirings 200 that extend in the first direction X from edges of the first area S1. Thus, the entire shape of the first area S1 may be a triangular shape. Also, because the connection wirings 200 may be bent in the direction parallel to the second direction Y and may extend from the central, first area, the shapes of the second areas S2 at both sides of the central, first area S1 may be inverted triangular shapes, and the connection wirings 200 may be bent in the −X-direction and may extend from the second areas S2. Thus, the first areas S1 outside the second areas S2 may have triangular shapes.

In the first areas S1 and the second areas S2, extension directions of the connection wirings 200 are different from each other. As the connection wirings 200 may reflect light, reflection characteristics in the first areas S1 and the second areas S2 may be different from each other and this difference may be noticeable to a user who is viewing the display device 10. As a result, the divisions within the display area AA where the first areas S1 and the second areas S2 meet may be recognized by a user. To reduce or prevent this phenomenon, the connection wirings 200 may include a plurality of branches that protrude in a direction perpendicular to the extension direction of the connection wirings 200. Thus, the first areas S1 and the second areas S2 may include the same or similar patterns. Thus, a difference in the reflection characteristics between the first areas S1 and the second areas S2 may be reduced. This will be described later with reference to FIGS. 2 through 7.

The peripheral area PA may at least partially surround the display area AA. The peripheral area PA that is an area in which the pixels P are not disposed, may include the pad area PADA, to which a variety of electronic devices or printed circuit boards (PCBs) are electrically attached. A voltage line for supplying power for driving the light-emitting device may also be disposed in the peripheral area PA.

FIG. 1 may be understood as a plan view illustrating the substrate 100 during a manufacturing process of the display device 10. In an electronic device, such as a finished product display device 10 or a smartphone including the display device 10, a portion of the substrate 100 may be bent back or behind the display area AA thereof so as to minimize the perceivable area of the peripheral area PA.

For example, as shown in FIG. 1, the peripheral area PA may include a bending area BA, and the bending area BA may be defined between the pad area PADA and the display area AA. In this case, the substrate 100 may be bent in the bending area BA so that at least some of the pad area PADA may at least partially overlap the display area AA. In this case, the bending direction of the pad area PADA is set so that the pad area PADA may be behind the display area AA. Thus, to the user, the display area AA may appear to make up most of the display device 10. To this end, the substrate 100 may include various flexible/bendable materials.

Figure 2:
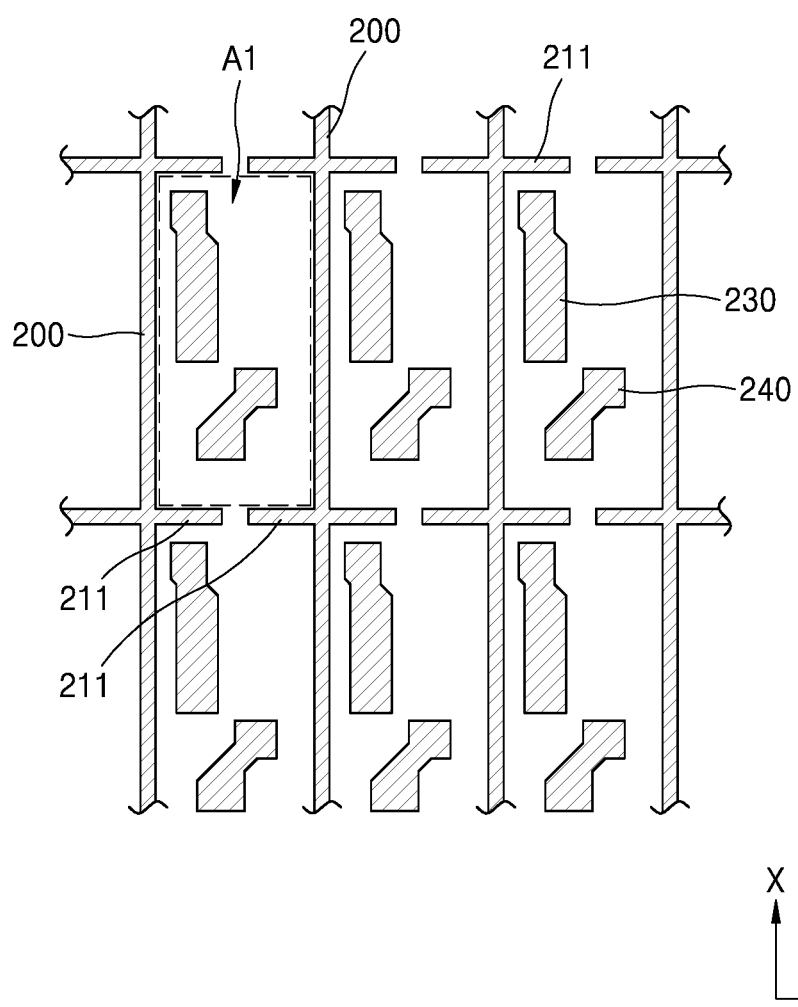
FIG. 2 is a plan view illustrating a first example of a portion A of FIG. 1.
Figure 3:
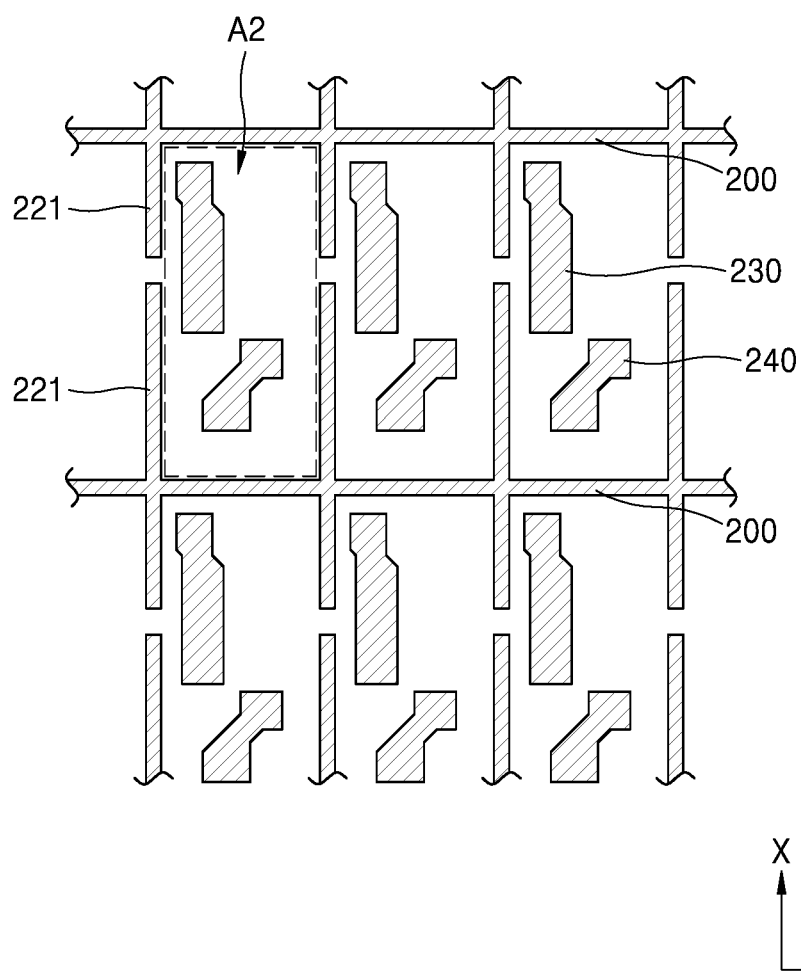
FIG. 3 is a plan view illustrating a first example of a portion B of FIG. 1.

FIG. 2 is a plan view illustrating an example of a portion A of FIG. 1, and FIG. 3 is a plan view illustrating an example of a portion B of FIG. 1. Hereinafter, exemplary embodiments of the present disclosure will be described with reference to FIGS. 1 through 3.

Referring to FIGS. 1 through 3, each of the connection wirings 200 may include a plurality of branches 211 (e.g. FIG. 3) and 221 (e.g. FIG. 3) that protrude in a direction perpendicular to a lengthwise direction of the connection wirings 200. Hereinafter, for convenience of description, a display area will be divided into a first area S1 and a second area S2.

As shown in FIG. 2, in the first area S1, the connection wirings 200 may extend in the direction parallel to the first direction X, and the first area S1 may include first branches 211 that protrude in the second direction Y.

The first branches 211 protrude symmetrically from the connection wirings. For example, the first branches 211 protrude from the connection wirings that extend in the first direction X in a both-side direction perpendicular to the lengthwise direction of the connection wirings 200. Also, a pair of first branches 211 that protrude from two adjacent connection wirings 200 among the connection wirings 200 arranged in parallel in the first area S1 towards each other may be disposed in the same line. Thus, as shown in FIG. 2, in the first area S1, two adjacent connection wirings 200 and the first branches 211 that protrude towards each other may divide first unit patterns A1. However, to prevent a short-circuit between the connection wirings 200, ends of the first branches 211 that extend from the two adjacent connection wirings 200 towards each other are spaced apart from each other.

Also, as shown in FIG. 3, in the second area S2, the connection wirings 200 may extend in the direction parallel to the second direction Y, and the second area S2 may include second branches 221 that protrude in the first direction X.

The second branches 221 protrude from the connection wirings that extend in the second direction to be symmetrical to each other. Also, a pair of second branches 221 that protrude from two adjacent connection wirings 200 towards each other in the second area S2 may be disposed in the same line. Thus, as shown in FIG. 3, in the second area S2, two adjacent connection wirings 200 and the second branches 221 that protrude from the two adjacent connection wirings 200 towards each other may divide second unit patterns A2. However, to prevent a short-circuit between the connection wirings 200, ends of the second branches 221 that extend from the two adjacent connection wirings 200 towards each other are spaced apart from each other.

Thus, one first unit pattern A1 in the first area S1 and one second unit pattern A2 in the second area S2 may have similar shapes. For example, there is only a difference that, in the first unit patterns A1, a gap is formed between the first branches 211 that extend towards each other, and in the second unit patterns A2, a gap is formed between the second branches 221 that extend towards each other, and the first unit pattern A1 and the second unit pattern A2 may have the same areas, and a total length of the connection wirings 200 that surround the first unit pattern A1 and the first branches 211 may be the same as a total length of the connection wirings 200 that surround the second unit pattern A2 and the second branches 221.

Thus, reflection characteristics of light in the first area S1 and the second area S2 are similar to each other. Thus, a phenomenon in which a display area is divided into the first area S1 and the second area S2, according to incidence angles of light and recognized, may be prevented or minimized.

A third area S3 may include first unit patterns A1 or/and second unit patterns A2. Thus, a phenomenon in which a viewer may be able to distinguish the third area S3 from the first area S1 and the second area S2 may be prevented. For example, because the third area S3 is in contact with the second area S2 having an inverted triangular shape and is continuous to the second area S2, when the third area S3 includes the second unit patterns A2, the phenomenon in which a viewer may be able to distinguish the third area S3 from the first area S1 and/or the second area S2 may be more effectively prevented.

When the third area S3 includes the first unit patterns A1 or/and the second unit patterns A2, the first unit patterns A1 and/or the second unit patterns A2 included in the third area S3 may be in floating states.

First and second dummy patterns 230 and 240 may be further disposed inside the first unit patterns A1 and the second unit patterns A2. The first and second dummy patterns 230 and 240 may be disposed between the two adjacent connection wirings 200 and disposed in the same layer as a layer in which the connection wirings 200 are disposed. In FIGS. 2 and 3, the first dummy patterns 230 and the second dummy patterns 240 are disposed inside the first unit patterns A1 and the second unit patterns A2, respectively. However, the present invention is not limited thereto, and dummy patterns having a variety of numbers and shapes may be used. The dummy patterns 230 and 240 may prevent signal interference between the circuit portion and the connection wirings 200 from occurring, and may secure a pattern density so that the device may be more easily manufactured.

Figure 4:
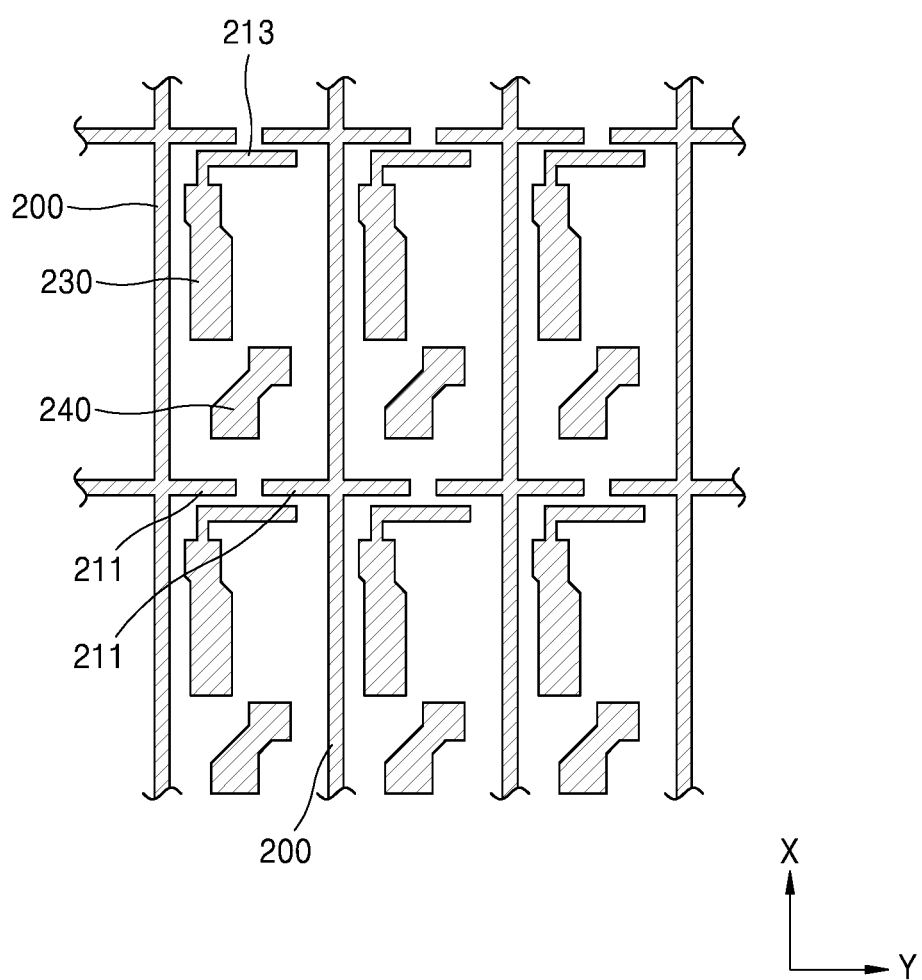
FIG. 4 is a plan view illustrating a second example of the portion A of FIG. 1.
Figure 5:
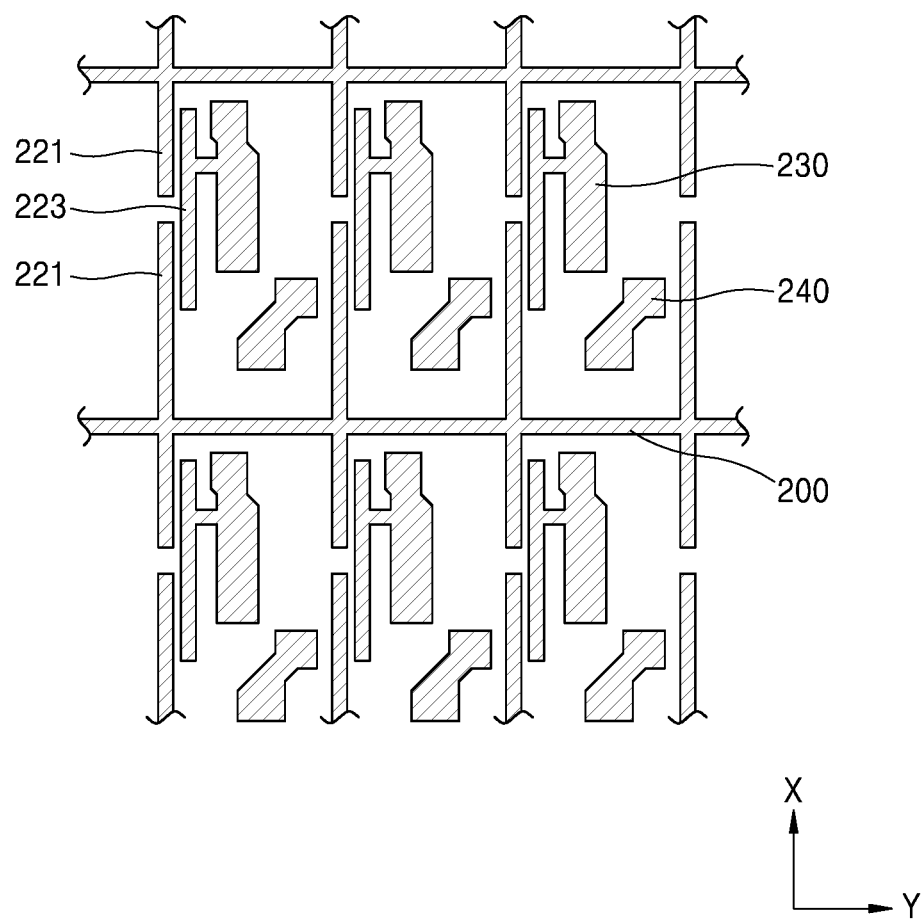
FIG. 5 is a plan view illustrating a second example of the portion B of FIG. 1.

FIG. 4 is a plan view illustrating another example of the portion A of FIG. 1, and FIG. 5 is a plan view illustrating another example of the portion B of FIG. 1. Hereinafter, this will be described with reference to FIGS. 1, 4, and 5.

Referring to FIGS. 1, 4, and 5, each of the connection wirings 200 may include a plurality of branches 211 and 221 that protrude in the direction perpendicular to the lengthwise direction of the connection wirings 200. As shown in FIG. 4, the connection wirings 200 that extend from the first area S1 in the first direction X, may include the first branches 211 that protrude in the second direction Y and as shown in FIG. 5, the connection wirings 200 that extend from the second area S2 in the second direction Y may include the second branches 221 that protrude in the first direction X so that reflection characteristics of light in the first area S1 and the second area S2 may be similar to each other and a phenomenon in which the display area is visibly divided into the first area S1 and the second area S2 may be prevented or minimized. Thus, only differences between what is shown in FIGS. 4 and 5 as compared the above description will be described and it is to be understood that to the extent that details have been omitted for certain elements, those elements may be at least similar to corresponding elements that have already been described. Also, for convenience of description, a display area will be divided into the first area S1 and the second area S2.

Referring to FIGS. 4 and 5, in the first area S1, a gap may be formed between the first branches 211 that extend from the two adjacent connection wirings 200 towards each other. In the second area S2, a gap may be formed between the second branches 221 that extend from the two adjacent connection wirings 200 towards each other. In this case, first cover patterns 213 that cover the gap between the first branches 211 may be further disposed in the first area S1, and second cover patterns 223 that cover the gap between the second branches 221 may be further disposed in the second area S2.

For example, the first cover patterns 213 may at least partially overlap ends of the first branches 211 that face each other, in the first direction X, i.e., in the same direction as the extension direction of the connection wirings 200 and may be apart from the ends of the first branches 211 that face each other, so as to prevent a short-circuit of the two adjacent connection wirings 200. Also, the first cover pattern 213 may be connected to the first dummy patterns 230 or the second dummy patterns 240 so as to fix positions of the first cover patterns 213. In FIG. 4, based on the drawings, the first cover patterns 213 may be disposed at a lower position than the first branches 211 and may be connected to the first dummy patterns 230. However, the present invention is not limited thereto, and the first cover patterns 213 may be disposed at an upper position than the first branches 211 and may be connected to the second dummy patterns 240 based on the drawings.

Similarly, as shown in FIG. 5, the second cover patterns 223 may at least partially overlap ends of the second branches 221 in the second direction Y, i.e., in the same direction as an extension direction of the connection wirings 200 and may be spaced apart from the ends of the second branches 221 so as to prevent a short-circuit of the two adjacent connection wirings 200. Also, the second cover patterns 223 may be connected to the first dummy patterns 230 or the second dummy patterns 240 so as to fix the positions of the second cover patterns 223.

In this way, when the first cover patterns 213 that overlap the ends of the first branches 211 are further disposed in the first area S1 and the second cover patterns 223 that overlap the ends of the second branches 221 are further disposed in the second area A1, shapes of the patterns included in the first area S1 and the second area S2 may be more similar to each other. Thus, a phenomenon in which, when the position of the gap between the first branches 211 in the first area S1 and the position of the gap between the second branches 221 in the second area S2 are different from each other, reflectivities of incident lights at certain angles may be different from each other, may be prevented. Thus, a phenomenon in which a display area may be divided into the first area S1 and the second area S2 and recognized, may be more effectively prevented. The first cover patterns 213 and the second cover patterns 223 may be disposed in the same layer as the layer in which the connection wirings 200 are disposed.

Figure 6:
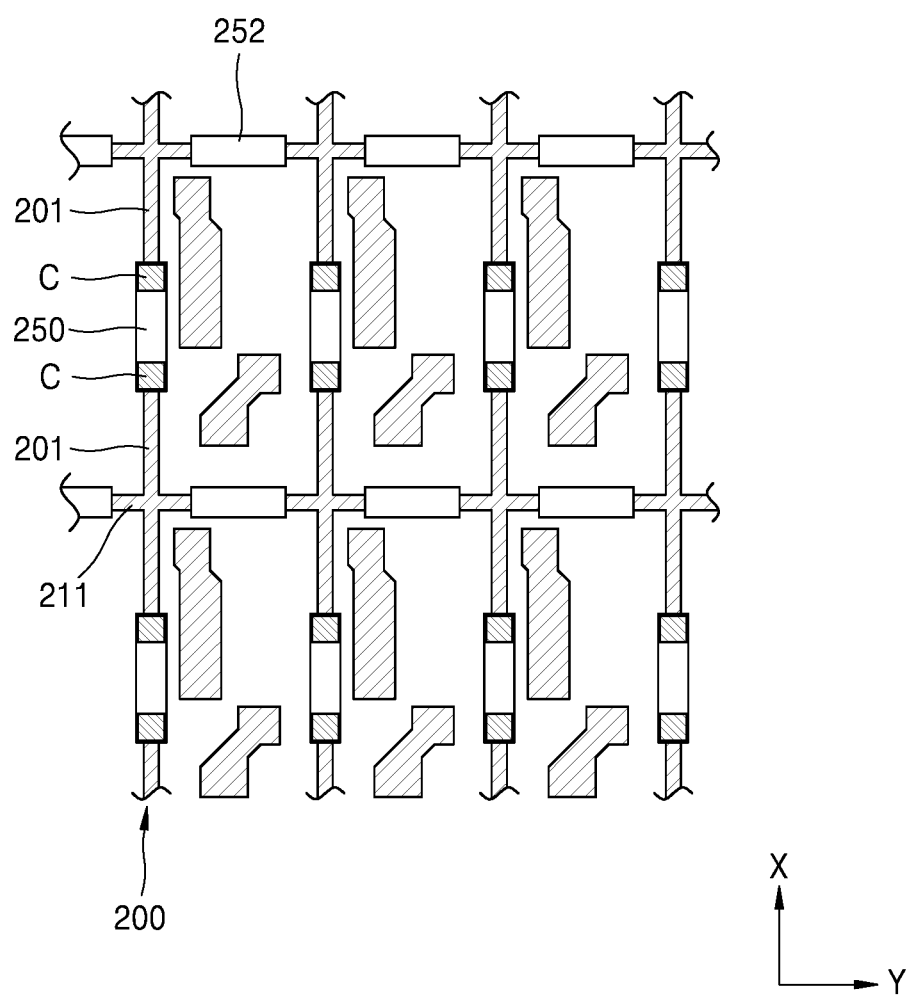
FIG. 6 is a plan view illustrating a third example of the portion A of FIG. 1.
Figure 7:
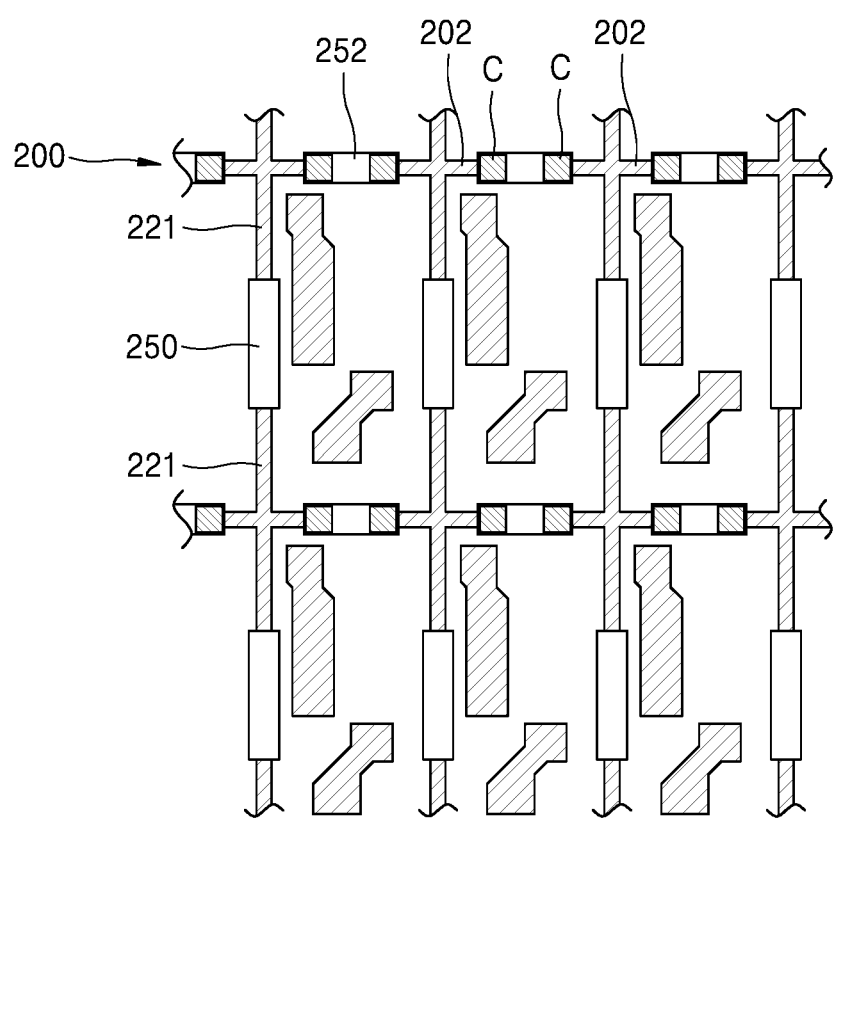
FIG. 7 is a plan view illustrating a third example of the portion B.

FIG. 6 is a plan view illustrating another example of the portion A of FIG. 1, and FIG. 7 is a plan view illustrating another example of the portion B. Hereinafter, this will be described with reference to FIGS. 1, 6, and 7.

Referring to FIGS. 1, 6, and 7, each of the connection wirings 200 may include a plurality of first and second branches 211 and 221 that protrude in the direction perpendicular to the lengthwise direction of the connection wirings 200. Also, each of the connection wirings 200 may include a plurality of first and second slices 201 and 202 that are spaced apart from each other in the direction parallel to the extension direction of the connection wirings 200 and a plurality of bridges 250 and 252 that electrically connect the plurality of slices 201 and 202 to each other (e.g. bridges 250 connect slices 201 to slices 201 and bridges 252 connect slices 202 to slices 202). In this case, the plurality of first and second branches 211 and 221 may protrude from the plurality of slices 201 and 202. Hereinafter, for convenience of description, a display area will be divided into the first area S1 and the second area S2.

First, as shown in FIG. 6, each of the connection wirings 200 that extend in the first direction X in the first area S1 may include the plurality of first slices 201 that are spaced apart from each other in the first direction X and a plurality of first bridges 250 that electrically connect the plurality of first slices 201. The plurality of first bridges 250 may be disposed in a different layer from a layer in which the plurality of first slices 201 are disposed, and may be electrically connected to the first slices 201 via a contact hole C.

Also, as shown in FIG. 7, each of the connection wirings 200 that extend in the second direction Y may include the plurality of second slices 202 in the second area S2, and the plurality of second slices 202 may be electrically connected to each other via the contact hole C using the plurality of second bridges 252.

As shown in FIG. 6, a pair of first branches 211 may protrude from each of the plurality of first slices 201 in opposite directions and may at least partially overlap ends of a pair of first branches 211 in which dummy bridges extend towards each other. The dummy bridges in the first area S1 may be the same as the second bridges 252. However, the first bridges 250 may be electrically connected to the first slices 201 via the contact hole C, whereas the second bridges 252 might not be connected to the first branches 211 and may be in insulated states. To this end, an insulating layer may be disposed between ends of the second bridges 252 and the pair of first branches 211. Thus, the connection wirings 200 that extend in the first direction X in the first area S1 may be prevented from being short circuited to each other via the first branches 211.

Also, each of the plurality of second slices 202 may include the second branches 221 that protrude from the second slices 202 in the direction perpendicular to the second direction Y, and dummy bridges may be disposed at a position where they overlap ends of a pair of second branches 221 that extend towards each other. The first bridges 250 may be dummy bridges in the second area S2. The first bridges 250 that are dummy bridges might not be connected to the second branches 221 and may be in an insulated state. Thus, the connection wirings 200 that extend in the second direction Y may be prevented from being short circuited to each other via the second branches 221.

For example, in the first area S1 and the second area S2, the first bridges 250 and the second bridges 252 are disposed at the same position. However, in the first area S1, only the first bridges 250 might be electrically connected to the first slices 201 via the contact hole C, and the second bridges 252 are dummy bridges. On the other hand, in the second area S2, only the second bridges 252 might be electrically connected to the second slices 202 via the contact hole C, and the first bridges 250 are dummy bridges. Thus, the first area S1 and the second area S2 include patterns having the same shapes. Thus, reflection characteristics in the first area S1 and the second area S2 may be the same, and accordingly, a phenomenon in which a display area is visibly divided into the first area S1 and the second area S2 may be prevented.

The first bridge 250 and the second bridge 252 may be disposed on the connection wirings 200. The first bridge 250 and the second bridge 252 may be formed of a transparent material, such as an indium tin oxide (ITO) or an opaque material. According to an exemplary embodiment of the present disclosure, the first bridge 250 and the second bridge 252 may also be disposed under the connection wirings 200. According to an exemplary embodiment of the present disclosure, the first bridge 250 and the second bridge 252 may be disposed in the same layer in which a source electrode and a drain electrode of a thin-film transistor (TFT) that will be described later are disposed, or in the same layer in which a gate electrode of the TFT is disposed.

A description of the third area S3 including the same patterns as those of the first area S1 or the second area S2 is the same as the above description.

Figure 8:
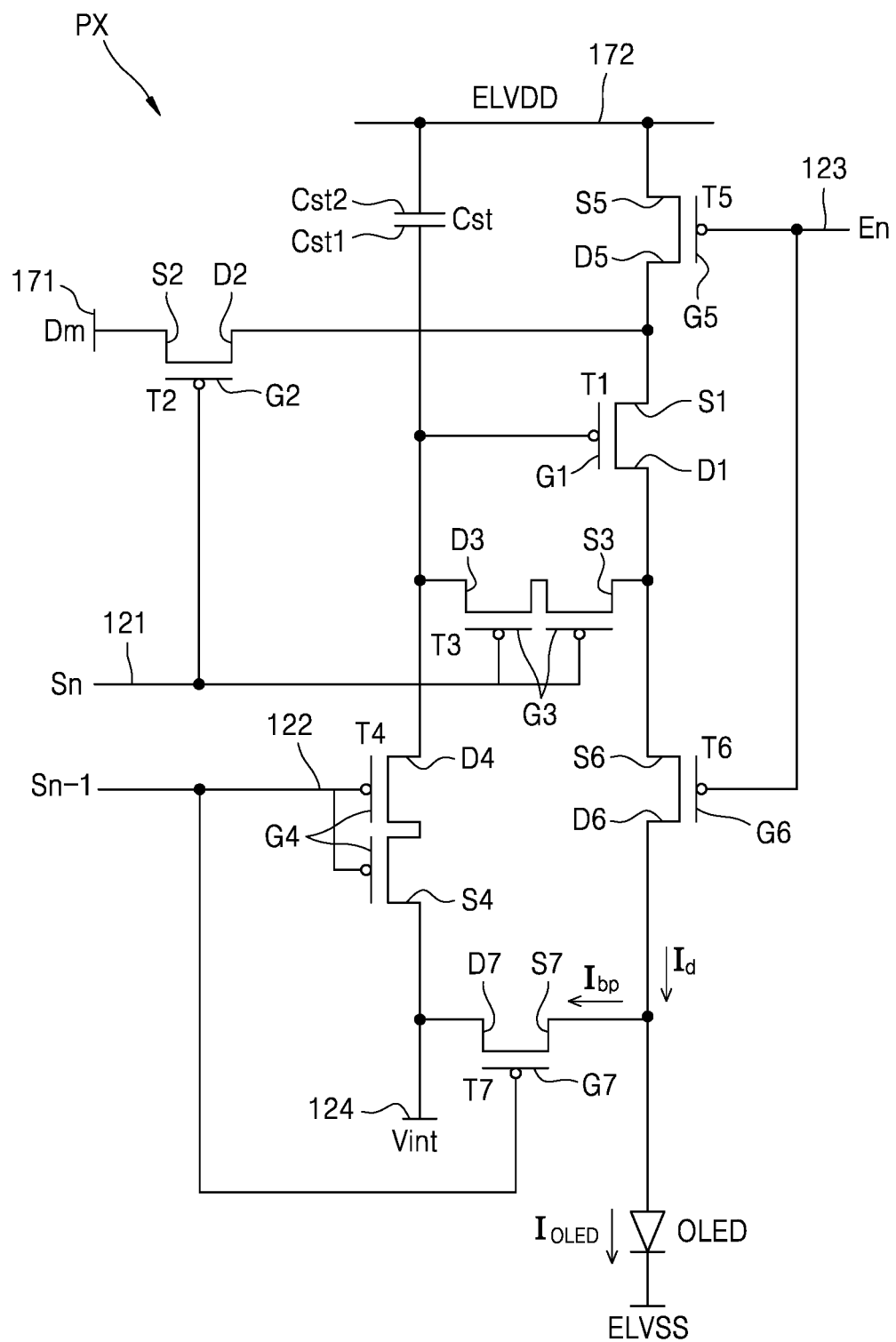
FIG. 8 is an equivalent circuit diagram illustrating one pixel of the display device of FIG. 1, according to an exemplary embodiment of the present disclosure.

FIG. 8 is an equivalent circuit diagram of one pixel of the display device of FIG. 1. As shown in FIG. 8, one pixel PX may include a plurality of TFTs T1, T2, T3, T4, T5, T6, and T7, a capacitor Cst, and an organic light-emitting device (OLED). The plurality of TFTs T1, T2, T3, T4, T5, T6, and T7 or the capacitor Cst may be included in the circuit portion of the pixel PX. The pixel portion is electrically connected to a plurality of signal lines 121, 122, 123, 124, and 171 and a power supply line 172.

The TFTs may include a driving TFT T1, a switching TFT T2, a compensation TFT T3, an initialization TFT T4, an operation control TFT T5, an emission control TFT T6, and a bypass TFT T7.

The plurality of signal lines may include a scan line 121 for transmitting a scan signal Sn, a previous scan line 122 for transmitting a previous scan signal Sn−1 to the initialization TFT T4 and the bypass TFT T7, an emission control line 123 for transmitting an emission control signal En to the operation control TFT T5 and the emission control TFT T6, a data line 171 that intersects the scan line 121 and transmits a data signal Dm, and an initialization voltage line 124 that transmits an initialization voltage Vint for initializing the driving TFT T1.

The driving TFT T1 receives the data signal Dm according to a switching operation of the switching TFT T2 and supplies a driving current $I_{OLED}$ to the OLED. A gate electrode G1 of the driving TFT T1 may be connected to a capacitor lower electrode Cst1 of the capacitor Cst. A source electrode S1 of the driving TFT T1 may pass through the operation control TFT T5 and may be connected to the power supply line 172. The driving electrode D1 of the driving TFT T1 may pass through the emission control TFT T6 and may be electrically connected to a pixel electrode of the OLED.

A gate electrode G2 of the switching TFT T2 may be connected to the scan line 121. A source electrode S2 of the switching TFT T2 may be connected to the data line 171. A drain electrode D2 of the switching TFT T2 may be connected to the source electrode S1 of the driving TFT T1, may pass through the operation control TFT T5, and may be connected to the power supply line 172. The switching TFT T2 may be turned on according to the scan signal Sn transmitted via the scan line 121 and may perform a switching operation of transmitting the data signal Dm transmitted to the data line 171 to the source electrode S1 of the driving TFT T1.

A gate electrode G3 of the compensation TFT T3 may be connected to the scan line 121. A source electrode S3 of the compensation TFT T3 may be connected to the drain electrode D1 of the driving TFT T1, may pass through the emission control TFT T6, and may be connected to the pixel electrode of the OLED. A drain electrode D3 of the compensation TFT T3 may be connected to the capacitor lower electrode Cst1 of the capacitor Cst, a drain electrode D4 of the initialization TFT T4 and the gate electrode G1 of the driving TFT T1. The compensation TFT T3 may be turned on according to the scan signal Sn transmitted via the scan line 121 and may electrically connect the gate electrode G1 to the drain electrode D1 of the driving TFT T1, thereby diode-connecting the driving TFT T1.

A gate electrode G4 of the initialization TFT T4 may be connected to the previous scan line 122. A source electrode S4 of the initialization TFT T4 may be connected to a drain electrode D7 of the bypass TFT T7 and the initialization voltage line 124. A drain electrode D4 of the initialization TFT T4 may be connected to the capacitor lower electrode Cst1 of the capacitor Cst, the drain electrode D3 of the compensation TFT T3, and the gate electrode G1 of the driving TFT T1. The initialization TFT T4 may be turned on according to the previous scan signal Sn−1 transmitted via the previous scan line 122 and may perform an initialization operation of transmitting the initialization voltage Vint to the gate electrode G1 of the driving TFT T1 and initializing a voltage of the gate electrode G1 of the driving TFT T1.

A gate electrode G5 of the operation control TFT T5 may be connected to the emission control line 123. A source electrode S5 of the operation control TFT T5 may be connected to the power supply line 172. A drain electrode D5 of the operation control TFT T5 may be connected to the source electrode S1 of the driving TFT T1 and the drain electrode D2 of the switching TFT T2.

A gate electrode G6 of the emission control TFT T6 may be connected to the emission control line 123. A source electrode S6 of the emission control TFT T6 may be connected to the drain electrode D1 of the driving TFT T1 and the source electrode S3 of the compensation TFT T3. A drain electrode D6 of the emission control TFT T6 may be electrically connected to the source electrode S7 of the bypass TFT T7 and the pixel electrode of the OLED. The operation control TFT T5 and the emission control TFT T6 may be simultaneously turned on according to the emission control signal En transmitted via the emission control line 123 and may allow a driving voltage ELVDD to be transmitted to the OLED so that the driving $I_{OLED}$ may flow through the OLED.

A gate electrode G7 of the bypass TFT T7 may be connected to the previous scan line 122. A source electrode S7 of the bypass TFT T7 may be connected to a drain electrode D6 of the emission control TFT T6 and the pixel electrode of the OLED. A drain electrode D7 of the bypass TFT T7 may be connected to the source electrode S4 of the initialization TFT T4 and the initialization voltage line 124. The bypass TFT T7 receives the previous scan signal Sn−1 transmitted via the previous scan line 122 from the gate electrode G7. When an electrical signal of a voltage at a certain level at which the bypass TFT T7 may be turned off, is applied from the previous scan signal Sn−1, the bypass TFT T7 may be in an off state so that some of the driving current $I_d$ may be discharged as a bypass current $I_{bp}$ via the bypass TFT T7.

Even when a minimum current of the driving TFT T1 that displays a black image flows as a driving current and the OLED emits light, the black image might not be properly displayed. Here, the minimum current of the driving TFT T1 refers to a current having conditions on that a gate-source voltage VGS of the driving TFT T1 is smaller than a threshold voltage Vth and the driving TFT T1 is turned off. Thus, even when the minimum current flows as the driving current, to prevent the OLED from emitting light, the bypass TFT T7 may disperse some of the current $I_d$ that flows from the driving TFT T1 as the bypass current $I_{bp}$ along other current paths than the current path toward the OLED. A smaller current than the minimum driving current (for example, a current that is equal to or smaller than 10 pA) on conditions that the driving TFT T1 is turned off, may be transmitted to the OLED so that the OLED might not emit light or a degree of emission may be minimized and thus the black image may be realized.

In FIG. 8, the initialization TFT T4 and the bypass TFT T7 are connected to the previous scan line 122. However, the present invention is not limited thereto. According to an exemplary embodiment of the present disclosure, the initialization TFT T4 may be connected to the previous scan line 122, may be driven according to the previous scan signal Sn−1, and the bypass TFT T7 may be connected to an additional wiring and may be driven according to a signal transmitted to the wiring.

A capacitor upper electrode Cst2 of the capacitor Cst may be connected to the power supply line 172, and an opposite electrode of the OLED may be connected to a common voltage ELVSS. Thus, the OLED may receive the driving current $I_{OLED}$ from the driving TFT T1 and may emit light.

In FIG. 8, the compensation TFT T3 and the initialization TFT T4 have a dual gate electrode. However, the present invention is not limited thereto. For example, the common TFT T3 and the initialization TFT T4 may have one gate electrode. Also, various other modifications may be made to at least one of the remaining TFTs T1, T2, T5, T6, and T7.

Figure 9:
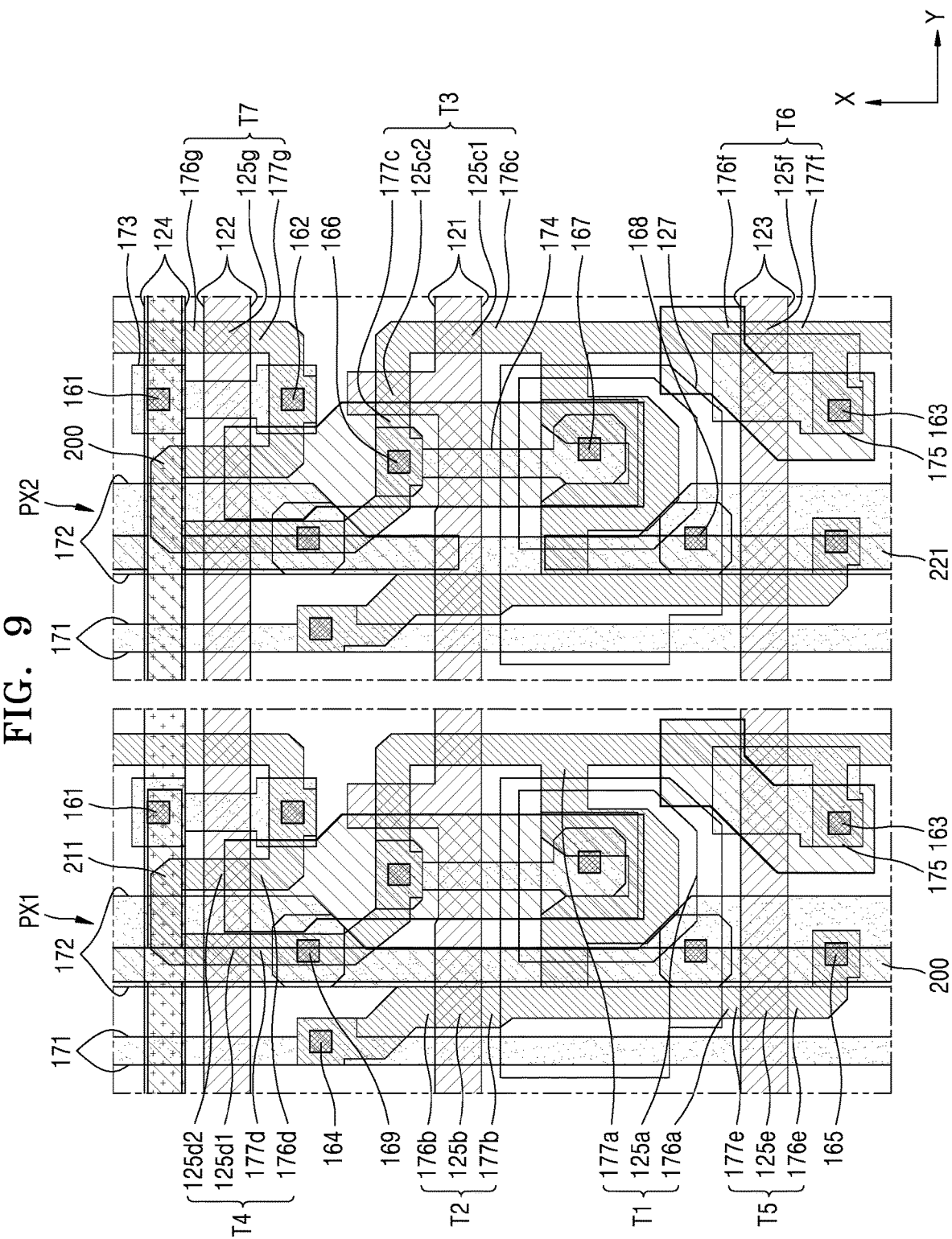
FIG. 9 is a layout view illustrating positions of thin-film transistors (TFTs) and a capacitor in a pixel included in the display device of FIG. 1, according to an exemplary embodiment of the present disclosure.
Figure 13:
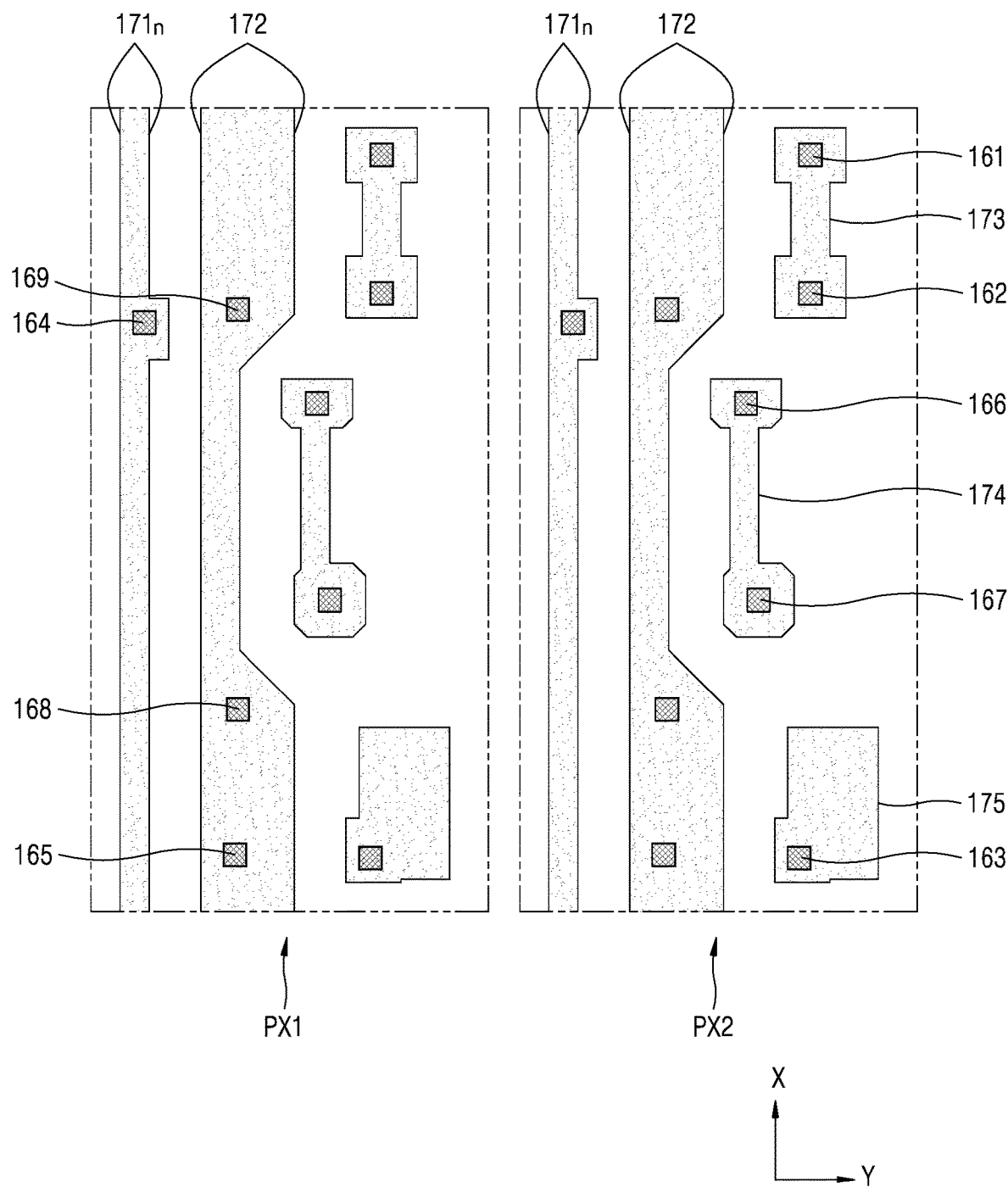
Figure 14:
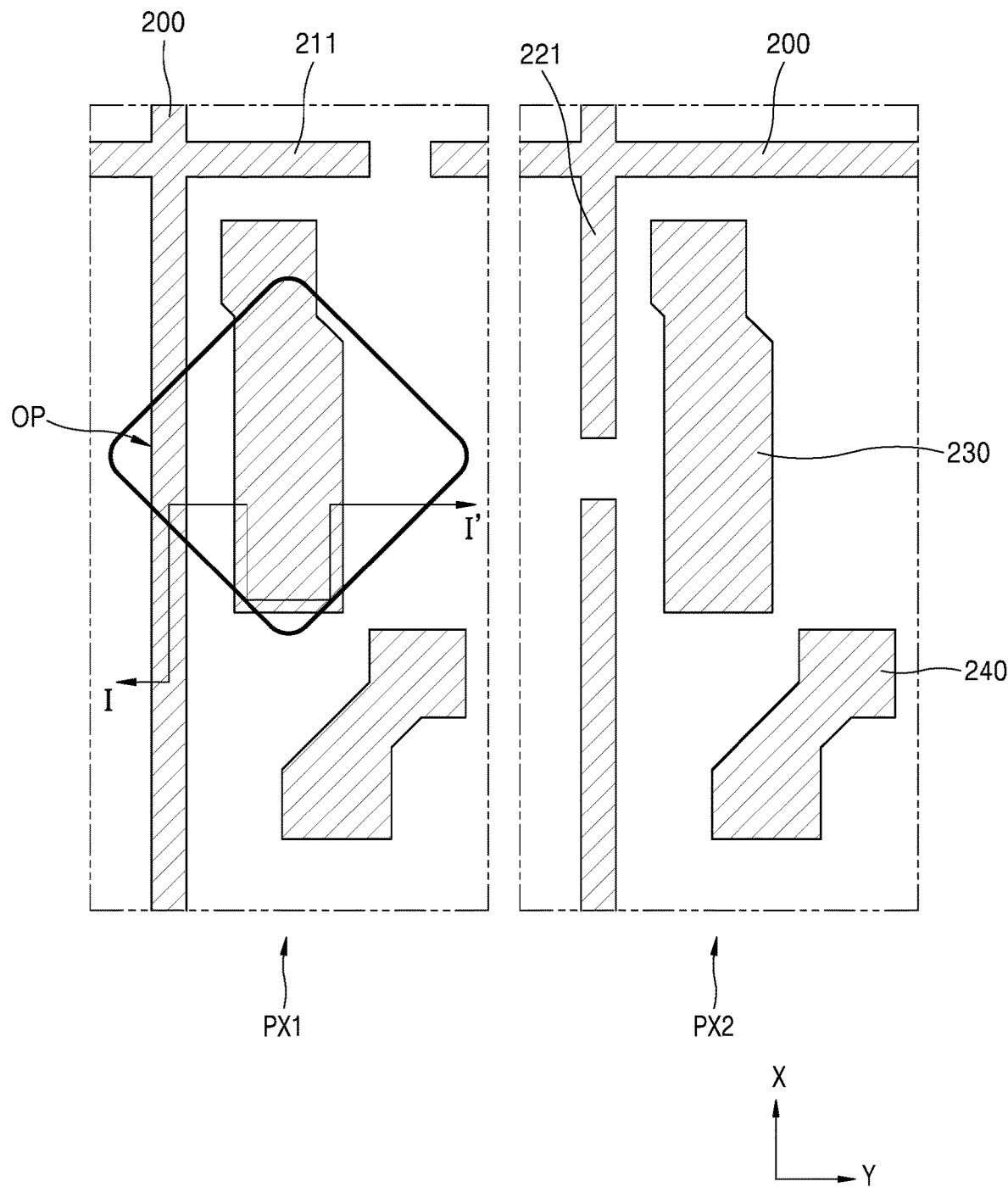
Figure 15:
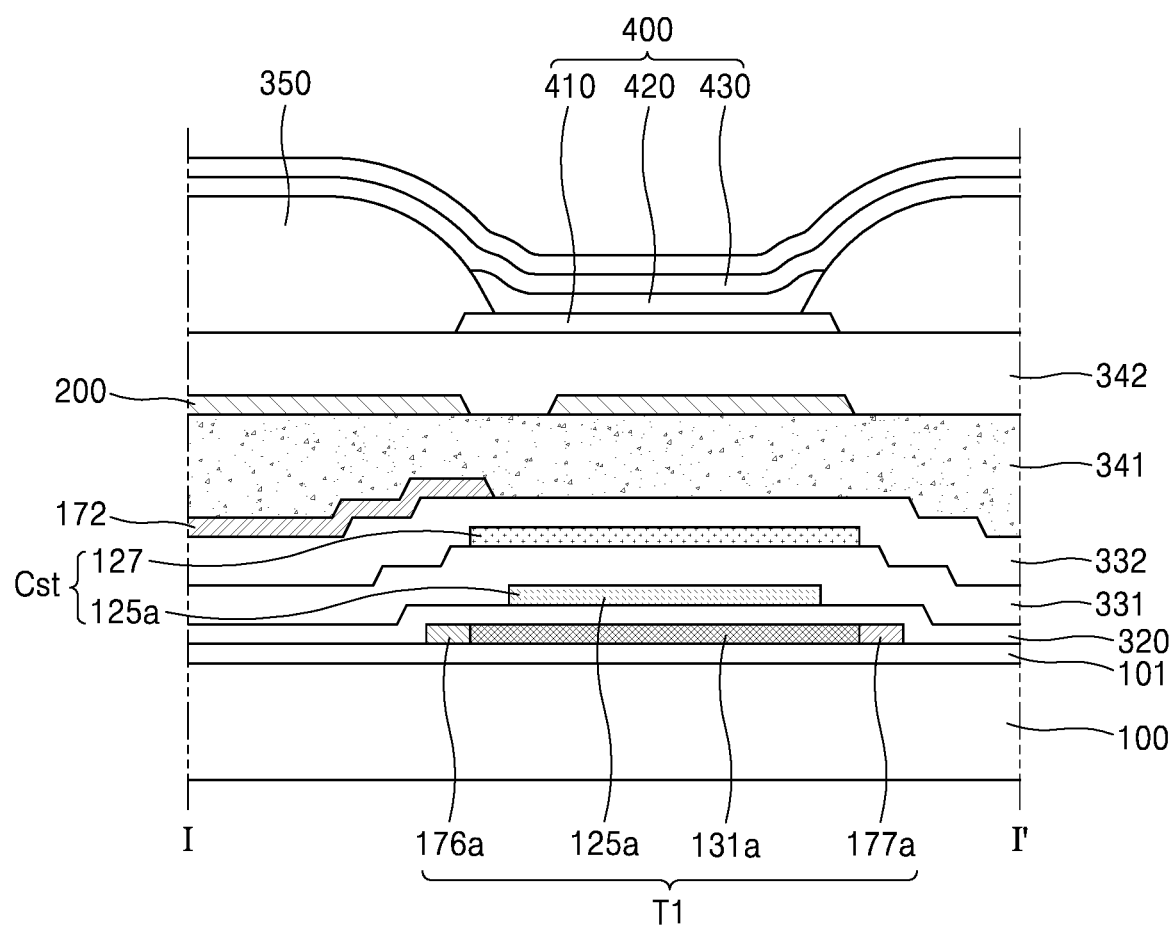
FIG. 15 is a cross-sectional view illustrating a portion of the display device of FIG. 1, according to an exemplary embodiment of the present disclosure.

FIG. 9 is a layout view illustrating positions of thin-film transistors (TFTs) and a capacitor in a pixel included in the display device of FIG. 1, FIGS. 10 through 14 are layout views illustrating elements, such as a plurality of TFTs and a capacitor of FIG. 9 according to layers, and FIG. 15 is a cross-sectional view illustrating some of the display device of FIG. 1.

Hereinafter, a detailed structure of the display device of FIG. 1 will be described with reference to FIGS. 9 through 15.

FIG. 9 illustrates positions of TFTs and a capacitor of each of a first pixel PX1 in the first area (see S1 of FIG. 1) and a second pixel PX2 in the second area (see S2 of FIG. 1), and FIGS. 10 through 14 illustrate various elements, such as TFTs and a capacitor of each of the first pixel PX1 and the second pixel PX2, according to layers. Also, FIG. 15 that is a cross-sectional view illustrating some of the display device of FIG. 1, for convenience, illustrates a cross-section taken along a line I-I' that passes through an opening OP indicated only in the first pixel PX1 of FIG. 14.

As shown in FIG. 15, the display device includes a substrate 100.

The substrate 100 may include a variety of flexible or bendable materials. For example, the substrate 100 may include polymer resin, such as polyethersulphone (PES), polyacrylate (PAR), polyetherimide (PEI), polyethylene napthalate (PEN), polyethylene terephthalate (PET), polyphenylene sulfide (PPS), polyarylate (PAR), polyimide (PI), polycarbonate (PC) and/or cellulose acetate propionate (CAP). It is to be understood that the substrate 100 may be modified in various ways like having a multi-layer structure including two layers including such polymer resin and a barrier layer including an inorganic material (silicon oxide ($SiO_x$), silicon nitride ($SiN_x$), and/or silicon oxynitride (SiON)) between the two layers.

A plurality of pixels including the first pixel PX1 and the second pixel PX2 may be disposed on the substrate 100. A buffer layer 101 may be disposed in the substrate 100. The buffer layer 101 may planarize a surface of the substrate 100 and/or may prevent impurities from penetrating into a semiconductor layer thereon. The buffer layer 101 may have a single layer structure or multi-layer structure including inorganic insulating material such as $SiO_x$, $SiN_x$, and/or SiON.

Figure 10:
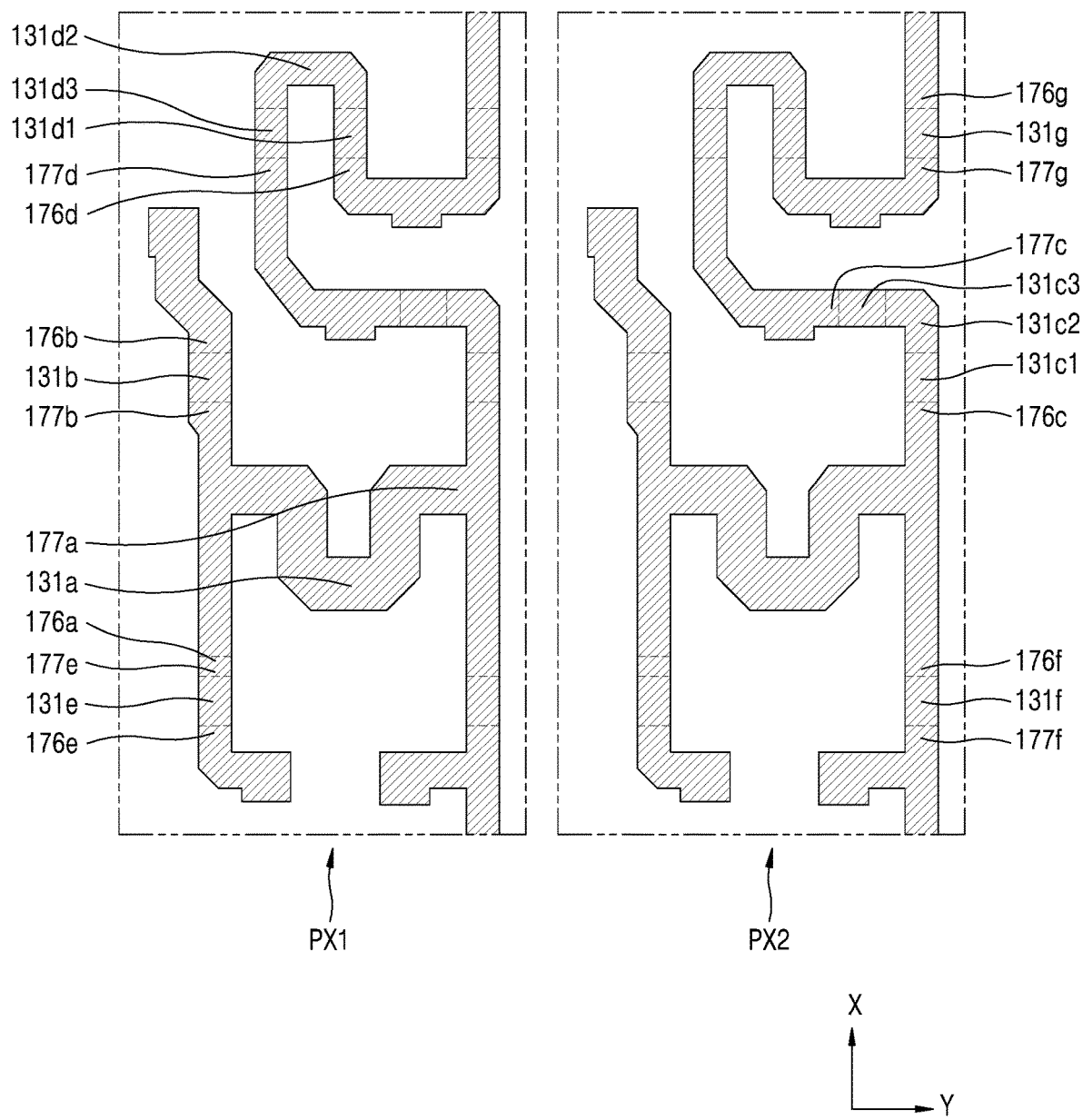
FIGS. 10 through 14 are layout views illustrating elements, such as a plurality of TFTs and a capacitor of FIG. 9, shown according to layers.

The semiconductor layer may be disposed on the buffer layer 101. The semiconductor layer may have various bent shapes, as shown in FIG. 10, and the first pixel PX1 and the second pixel PX2 may have semiconductor layers having the same shape. Hereinafter, unless otherwise specified, it may be assumed that layers of each of the first pixel PX1 and the second pixel PX2 have the same shape.

The semiconductor layer may include a driving channel area 131a that corresponds to the driving TFT T1, a switching channel area 131b that corresponds to the switching TFT T2, compensation channel areas 131c1, 131c2, and 131c3 that correspond to the compensation TFT T3, initialization channel areas 131d1, 131d2, and 131d3 that correspond to the initialization TFT T4, an operation control channel area 131e that corresponds to the operation control TFT T5, an emission control channel area 131f that corresponds to the emission control TFT T6, and a bypass channel area 131g that corresponds to the bypass TFT T7. For example, the driving channel area 131a, the switching channel area 131b, the compensation channel areas 131c1, 131c2, and 131c3, the initialization channel areas 131d1, 131d2, and 131d3, the operation control channel area 131e, the emission control channel area 131f, and the bypass channel area 131g may be some of the areas of the semiconductor layer shown in FIG. 10.

The semiconductor layer may include polysilicon. The semiconductor layer may include source areas and drain areas formed by doping impurities at both sides of the channel area. Here, the impurities may be changed according to the type of a TFT and may include N-type impurities or P-type impurities. A channel area, a source area at one side of the channel area, and a drain area at the other side of the channel may be referred to collectively as an active layer. For example, the TFT may have an active layer, and the active layer may include a channel area, a source area, and a drain area.

The source area or drain area formed by doping may be interpreted as either a source electrode or drain electrode of the TFT. For example, the driving source electrode may correspond to a driving source area 176a into which an impurity is doped, near the driving channel area 131a in the semiconductor layer shown in FIG. 10, and the driving drain electrode may correspond to a driving drain area 177a into which an impurity is doped, near the driving channel area 131a in the semiconductor layer shown in FIG. 10.

A gate insulating layer 320 formed of an inorganic insulating material, such as $SiO_x$, $SiN_x$, or SiON, may be disposed in an upper portion of the semiconductor layer.

Conductive layers, such as the gate electrode 125a are disposed on the gate insulating layer 320. Various other conductive layers may be disposed on the gate insulating layer 320. In this way, various conductive layers disposed on the gate insulating layer 320 may be referred to as a gate wiring. The gate wiring may include a scan line 121, a previous scan line 122, an emission control line 123, and a capacitor lower electrode, as shown in FIG. 11.

The capacitor Cst may at least partially overlap the driving TFT T1. In this case, the capacitor's lower electrode may be a gate electrode 125a of the driving TFT T1. Thus, the area of the capacitor Cst and the driving TFT T1 may be increased, and a high-quality image may be provided. However, the present invention is not limited thereto. According to an exemplary embodiment of the present disclosure, the capacitor Cst might not overlap the driving TFT T1, and the capacitor lower electrode may be a separate independent element from the gate electrode 125a of the driving TFT T1.

Figure 11:
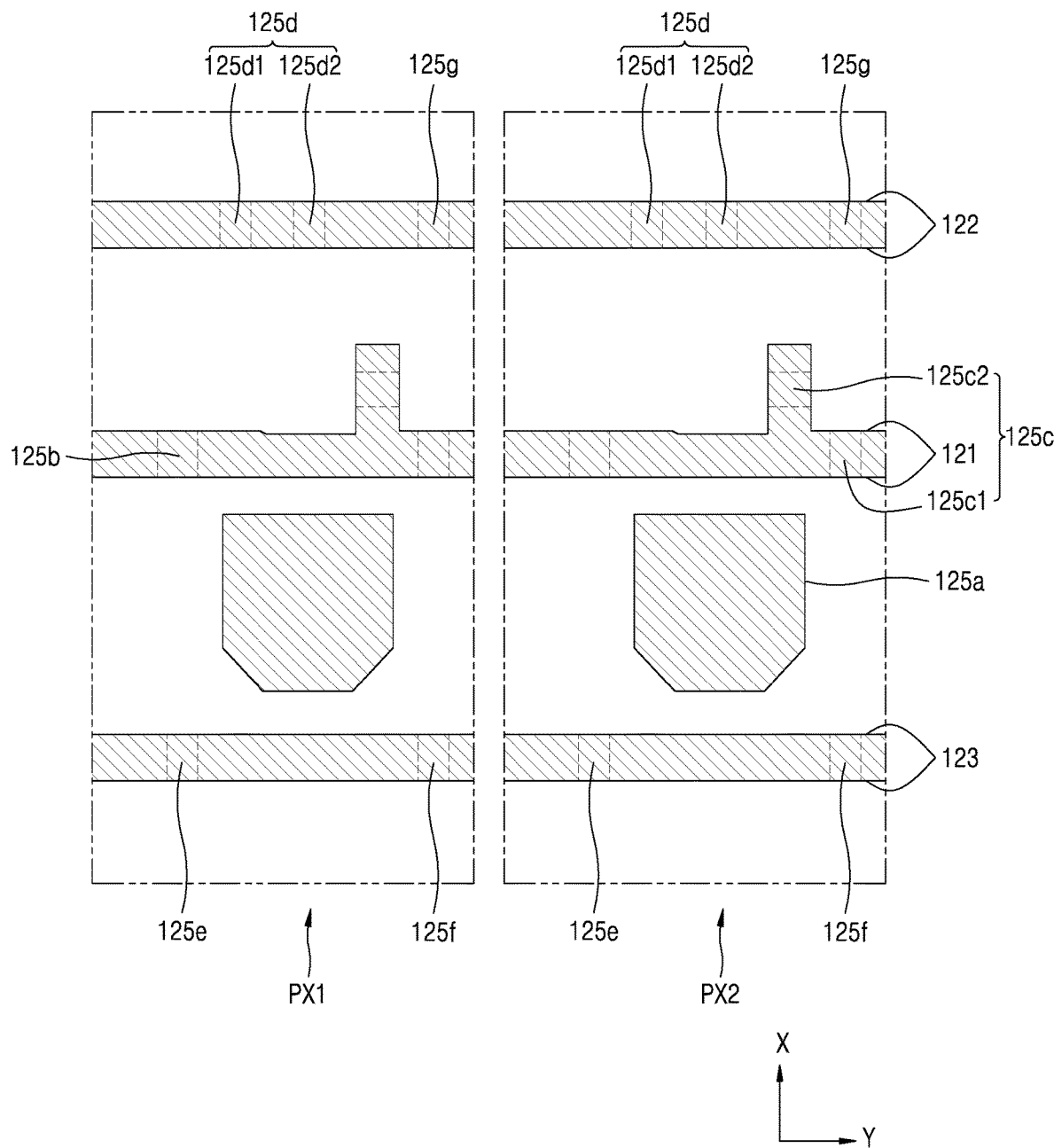

As shown in FIG. 11, the switching gate electrode 125b and the compensation gate electrodes 125c1 and 125c2 may be portions of the scan line 121 that intersects the semiconductor layer, or portions protruding from the scan line 121, and the initialization gate electrodes 125d1 and 125d2 and the bypass gate electrode 125g may be portions of the previous scan line 122 that intersects the semiconductor layer, or portions protruding from the previous scan line 122, and the operation control gate electrode 125e and the emission control gate electrode 125f may be portions of the emission control line 123 that intersects the semiconductor layer, or portions protruding from the emission control line 123.

A first interlayer insulating layer 331 may cover a gate wiring. The first interlayer insulating layer 331 may be formed of an inorganic insulating material, such as $SiN_x$, $SiO_x$, and/or SiON.

A capacitor's upper electrode 127 may be disposed on the first interlayer insulating layer 331. However, the initialization voltage line 124 may be disposed in the same layer as a layer in which the capacitor upper electrode 127 is disposed.

Figure 12:
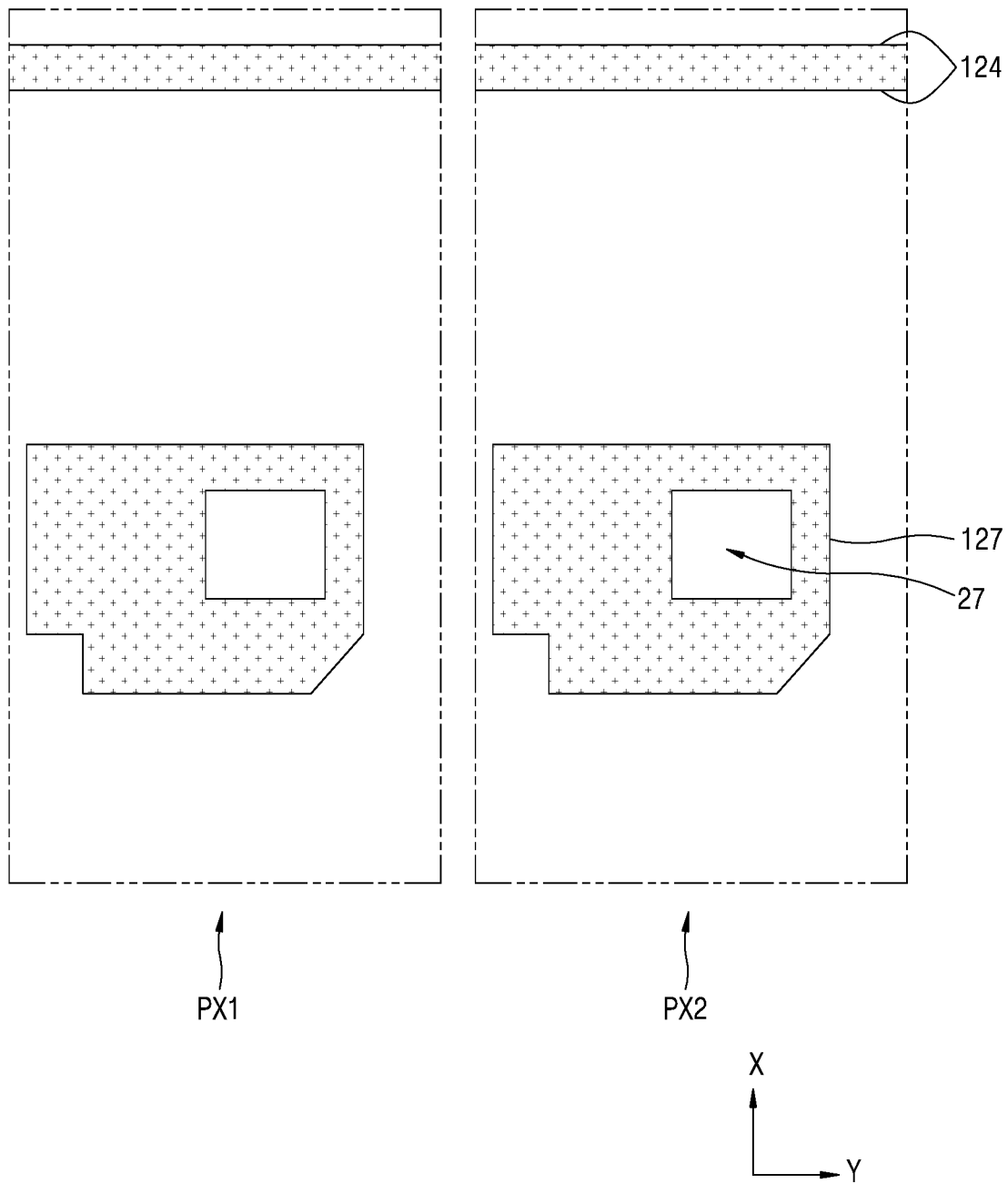

As shown in FIG. 12, an opening 27 may be formed in the capacitor's upper electrode 127. Thus, the capacitor's lower electrode and a compensation drain area 177c of the compensation TFT T3 may be electrically connected to each other using a connection member 174 to be described later.

A second interlayer insulating layer 332 is disposed on the capacitor upper electrode 127. The second interlayer insulating layer 332 may be formed of an inorganic insulating material, such as $SiN_x$, $SiO_x$, and/or SiON.

The power supply line 172 may be disposed on the second interlayer insulating layer 332. The power supply line 172 may be connected to the capacitor upper electrode 127 via a contact hole 168 formed in the second interlayer insulating layer 332 and may be connected to the semiconductor layer thereunder via contact holes 165 and 169 formed in the gate insulating layer 320, the first interlayer insulating layer 331, and the second interlayer insulating layer 332.

Various conductive layers other than the power supply line 172 may be disposed on the second interlayer insulating layer 332. For example, as shown in FIG. 13, the data line 171, an initialization connection line 173, the connection member 174, and the drain electrode 175 may be formed on the second interlayer insulating layer 332.

The data line 171 may be connected to a switching source area 176b via the contact hole 164 formed in the gate insulating layer 320, the first interlayer insulating layer 331, and the second interlayer insulating layer 332.

One end of the initialization connection line 173 may be connected to the initialization voltage line 124 via the contact hole 161 formed in the first interlayer insulating layer 331 and the second interlayer insulating layer 332. The other end of the initialization connection line 173 may be connected to the initialization source area 176d via the contact hole 162 formed in the gate insulating layer 320, the first interlayer insulating layer 331, and the second interlayer insulating layer 332. The initialization drain area 177d may be a portion of the semiconductor layer into which an impurity at an opposite side to the initialization source area 176d based on the initialization channel area 131d is doped.

One end of the connection member 174 may be connected to the compensation drain area 177c and the initialization drain area 177d via the contact hole 166 formed in the gate insulating layer 320, the first interlayer insulating layer 331, and the second interlayer insulating layer 332, and the other end of the connection member 174 may be connected to the capacitor lower electrode via the contact hole 167 formed in the first interlayer insulating layer 331 and the second interlayer insulating layer 332. In this case, the other end of the connection member 174 may be connected to the capacitor lower electrode via an opening 27 formed in the capacitor upper electrode 127.

The drain electrode 175 may be connected to the emission control drain area 177f via a contact hole 163 formed in the gate insulating layer 320, the first interlayer insulating layer 331, and the second interlayer insulating layer 332. The drain electrode 175 may be electrically connected to the pixel electrode 410. A source electrode excluding the drain electrode 175 may be disposed on the second interlayer insulating layer 332.

A first organic insulating layer 341 may be disposed on the power supply line 172 and the drain electrode 175, and the connection wirings 200 and the dummy patterns 230 and 240 may be formed on the first organic insulating layer 341, as shown in FIG. 14. Also, a second organic insulating layer 342 may be disposed on the connection wirings 200 and the dummy patterns 230 and 240.

Each of the first organic insulating layer 341 and the second organic insulating layer 342 may include imide-based polymer, general-purpose polymer such as polymethyl methacrylate (PMMA) or polystyrene (PS), polymer derivatives having a phenol-based group, acryl-based polymer, aryl ether-based polymer, amide-based polymer, fluorine (F)-based polymer, p-xylene-based polymer, vinyl alcohol-based polymer, and a blend thereof.

The connection wirings 200 and the dummy patterns 230 and 240 may have a single layer structure or multi-layer structure including aluminum (Al), copper (Cu), titanium (Ti), and/or an alloy thereof.

In the first pixel PX1, the connection wirings 200 extend in a direction parallel to the first direction X. For example, the connection wirings 200 may at least partially overlap the power supply line 172. The first branches 211 that protrude from the connection wirings 200 in a direction perpendicular to the lengthwise direction of the connection wirings 200 may at least partially overlap the initialization voltage line 124 in one example.

In the second pixel PX2, the connection wirings 200 may extend in the direction parallel to the second direction Y, and the second branches 221 may protrude from the connection wirings 200. For example, in the second pixel PX2, the connection wirings 200 may at least partially overlap the initialization voltage line 124, and the second branches 221 may at least partially overlap the power supply line 172.

Thus, patterns formed by the connection wirings 200 and the first branches 211 in the first pixel PX1 and patterns formed by the connection wirings 200 and the second branches 221 in the second pixel PX2 are similar to each other. Thus, a phenomenon in which a display area may be divided into the first area S1 and the second area S2 and recognized according to an incidence angle of light, may be prevented or minimized.

The first dummy patterns 230 and the second dummy patterns 240 may prevent signal interference between the circuit portion and the connection wirings 200, as described above, and may secure a pattern density, thereby providing a simplified manufacturing process.

In FIG. 14, the connection wirings 200 described with reference to FIGS. 2 and 3 are used. However, the display device may include the connection wirings 200 described with reference to FIGS. 4 through 7.

A light-emitting device 400 may be disposed on the second organic insulating layer 342, wherein the light-emitting device 400 may include a pixel electrode 410, a common electrode 430, and an intermediate layer 420 interposed between the pixel electrode 410 and the common electrode 430 and including an emission layer. The light-emitting device 400 may be an OLED, for example.

The pixel electrode 410 may be a (semi-)transparent electrode (i.e. a transparent electrode or a semitransparent electrode) or reflective electrode. When the pixel electrode 410 is a (semi-)transparent electrode, the pixel electrode 410 may include indium tin oxide (ITO), indium zinc oxide (IZO), zinc oxide (ZnO), indium oxide ($In_2O_3$), indium gallium oxide (IGO) and/or AZO, for example. When the pixel electrode 410 is a reflective electrode, the pixel electrode 410 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a layer formed of ITO, IZO, ZnO, $In_2O_3$, IGO or AZO. The present invention is not limited thereto, and the pixel electrode 410 may include various materials, and the pixel electrode 410 may be variably modified like having a single layer structure or multi-layer structure.

A pixel-defining layer 350 for covering edges of the pixel electrode 410 may be disposed on the second organic insulating layer 342. The pixel-defining layer 350 may have an opening OP corresponding to each of pixels, i.e., an opening OP through which at least the center of the pixel electrode 410 is exposed, thereby defining a pixel. Also, the pixel-defining layer 350 increases a distance between the edges of the pixel electrode 410 and the common electrode 430, thereby preventing electrical arcing from occurring therebetween. The pixel-defining layer 350 may be formed of an organic material, such as polyimide or hexamethyldisiloxane (HMDSO).

The intermediate layer 420 may be formed on the pixel electrode 410 exposed through the opening OP of the pixel-defining layer 350. The intermediate layer 420 may include a small molecular weight material or polymer material. When the intermediate layer 420 includes a small molecular weight material, the intermediate layer 420 may have a structure in which a hole injection layer (HIL), a hole transport layer (HTL), an emission layer (EML), an electron transport layer (ETL) and an electron injection layer (EIL) are stacked in a single or composite structure. The intermediate layer 420 may include various organic materials including copper phthalocyanine (CuPc), N,N'-Di(naphthalene-1-yl)-N,N'-diphenyl-benzidine (NPB), and tris-8-hydroxyquinoline aluminum)(Alq3). These layers may be formed through a method such as vacuum deposition.

When the intermediate layer 420 includes a polymer material, the intermediate layer 420 may have a structure including mostly an HTL and an EML. In this case, the HTL may include poly-3,4-alkenedioxythiophene (PEDOT), and the EML may include a poly-phenylenevinylene (PPV)-based and polyfluorene-based polymer material. The structure of the intermediate layer 420 is not limited to the above description but the intermediate layer 420 may have various different structures. For example, the intermediate layer 420 may include a layer integrally formed in the plurality of pixel electrodes 410 or may include a patterned layer to correspond to each of the plurality of pixel electrodes 410.

The common electrode 430 may cover a display area (see AA of FIG. 1). For example, the common electrode 430 may be formed as one body so as to cover the plurality of light-emitting devices 400. The common electrode 430 may be a (semi-)transparent electrode or reflective electrode. When the common electrode 430 is a (semi-)transparent electrode, the common electrode 430 may have a layer formed of metal having a small work function, e.g., Li, Ca, LiF/Ca, LiF/Al, Al, Ag, Mg, (or another material having a work function within a range established by the aforementioned materials) and/or a compound thereof and a (semi-)transparent conductive layer such as ITO, IZO, ZnO or $In_2O_3$. When the common electrode 430 is a reflective electrode, the common electrode 430 may have a layer formed of Li, Ca, LiF/Ca, LiF/Al, Al, Ag, Mg, and/or a compound thereof. The configuration and material of the common electrode 430 are not limited thereto, and various modifications are possible.

As described above, as connection wirings for transmitting a data signal to a data line are disposed within a display area, a dead space of a display device may be reduced. Also, reflection characteristics of light are the same or similar in the entire display area. Thus, a phenomenon in which an area in which connection wirings are disposed, becomes noticeable, may be prevented.

While various exemplary embodiments of the present disclosure have been described herein with reference to the figures, it will be understood by those of ordinary skill in the art that various changes in form and details may be made therein without departing from the spirit and scope of the present disclosure.

What is claimed is:

1. A display device, comprising:
   a substrate including a display area, a peripheral area at least partially surrounding the display area, and a pad area within the peripheral area;
   a plurality of data lines disposed within the display area; and
   a plurality of connection wirings disposed within the display area, connected to the plurality of data lines, and configured to transmit a data signal from the pad area to the plurality of data lines,
   wherein each of the plurality of connection wirings comprises a plurality of branches that protrude from the connection wirings in a direction perpendicular to a direction in which the connection wirings are primarily extended.

2. The display device of claim 1, wherein each the plurality of connection wirings are arranged in parallel with respect to each other, and a pair of branches that protrude from two adjacent connection wirings from among the plurality of connection wirings protrude towards each other and are positioned in a same line and ends of the pair of branches are spaced apart from each other.

3. The display device of claim 2, further comprising cover patterns that at least partially overlap the ends of the pair of branches in a same direction as the direction of primary extension of the connection wirings, wherein the cover patterns are spaced apart from the ends of the pair of branches in the same direction as the direction of primary extension of the connection wirings, and are positioned in a same layer as a layer in which the connection wirings are disposed.

4. The display device of claim 3, further comprising dummy patterns disposed between the two adjacent connection wirings of the plurality of connection wirings in a same layer as a layer in which the connection wirings are disposed.

5. The display device of claim 4, wherein the cover patterns are connected to the dummy patterns.

6. The display device of claim 2, wherein each of the plurality of connection wirings comprises a plurality of slices that are spaced apart from each other in the direction of primary extension of the connection wirings and a plurality of bridges electrically connecting each of the plurality of slices to each other.

7. The display device of claim 6, wherein the plurality of branches protrude from the plurality of slices, and the display device further comprises dummy bridges that at least partially overlap one another in a direction perpendicular to a direction of primary extension of the ends of the pair of branches.

8. The display device of claim 7, wherein an insulating layer is disposed between the dummy bridges and the ends of the pair of first branches.

9. The display device of claim 1, wherein the display area comprises a first area in which the plurality of connection wirings extend in a first direction, a second area in which the plurality of connection wirings extend in a second direction that is perpendicular to the first direction, and a third area that is a remaining area of the display area excluding the first area and the second area.

10. The display device of claim 9, wherein, two adjacent connection wirings from among the plurality of connection wirings and the branches that extend towards each other from the two adjacent connection wirings define first unit patterns in the first area, two adjacent connection wirings from among the plurality of connection wirings and the branches that extend towards each other from the two adjacent connection wirings define, in the second area, second unit patterns having a same area as the first unit patterns, the third area comprises the first unit patterns or the second unit patterns, and the first unit patterns or the second unit patterns included in the third area are in floating states.

11. A display device, comprising:
a substrate including a display area, a peripheral area at least partially surrounding the display area, and a pad area within the peripheral area;
a plurality of data lines disposed within the display area; and
a plurality of connection wirings disposed within the display area, connected to the plurality of data lines, and configured to transmit a data signal supplied from the pad area to the plurality of data lines,
wherein the display area comprises a first area in which the plurality of connection wirings extend in a first direction, and a second area in which the plurality of connection wirings extend in a second direction that is perpendicular to the first direction.

12. The display device of claim 11, wherein, in the first area, each of the plurality of connection wirings comprises a plurality of first branches that extend from the connection wirings in the second direction, and in the second area, each of the plurality of connection wirings comprises a plurality of second branches that extend from the connection wirings in the first direction.

13. The display device of claim 12, wherein, the first branches that extend towards each other from two adjacent connection wirings from among the plurality of connection wirings are disposed in a same line in the first area, and the second branches that extend towards each other from two adjacent connection wirings from among the plurality of connection wirings are disposed in a same line in the second area.

14. The display device of claim 13, wherein, the two adjacent connection wirings and the first branches that extend towards each other from the two adjacent connection wirings define first unit patterns in the first area, the two adjacent connection wirings and the second branches that extend towards each other from the two adjacent connection wirings define second unit patterns in the second area, and each of the first unit patterns and each of the second unit patterns have equal areas.

15. The display device of claim 14, wherein the display area further comprises a third area that is a remaining area of the display area excluding the first area and the second area, wherein the third area comprises the first unit patterns or the second unit patterns, and the first unit patterns or the second unit patterns included in the third area are in floating states.

16. The display device of claim 13, wherein the first area further comprises first cover patterns that at least partially overlap ends of the first branches extending towards each other in the first direction, and the second area further comprises second cover patterns that overlap ends of the second branches protruding towards each other in the second direction.

17. The display device of claim 13, wherein, in the first area, each of the plurality of connection wirings comprises a plurality of first slices that are spaced apart from each other in the first direction, and a plurality of bridges electrically connect the plurality of first slices to one another.

18. The display device of claim 17, wherein the plurality of first branches protrude from the plurality of first slices, and the display device further comprises dummy bridges that at least partially overlap each other in a direction perpendicular to the ends of the first branches.

19. The display device of claim 13, wherein, in the second area, each of the plurality of connection wirings comprises a plurality of second slices that are spaced apart from each other in the second direction, and a plurality of bridges electrically connecting the plurality of second slices to one another.

20. The display device of claim 19, wherein the plurality of second branches protrude from the plurality of second slices, and the display device further comprises dummy bridges that overlap one another in a direction perpendicular to the ends of the second branches.

* * * * *